United States Patent [19]

Klein et al.

[11] Patent Number: 4,542,309
[45] Date of Patent: Sep. 17, 1985

[54] PHASE SPLITTER WITH INTEGRATED LATCH CIRCUIT

[75] Inventors: Wilfried Klein, Holzgerlingen; Erich Klink, Schönaich; Knut Najmann, Gärtringen; Friedrich Wernicke, Schönaich, all of Fed. Rep. of Germany

[73] Assignee: International Business Machines Corporation, Armok, N.Y.

[21] Appl. No.: 468,447

[22] Filed: Feb. 22, 1983

[30] Foreign Application Priority Data

Jul. 13, 1982 [DE] Fed. Rep. of Germany ..... 82106254

[51] Int. Cl.[4] ................. H03K 5/22; H03K 17/56
[52] U.S. Cl. ........................ 307/513; 307/262; 307/479; 307/247 R
[58] Field of Search ............ 307/511, 513, 262, 269, 307/279, 289, 291, 479, 247 R; 328/24, 55

[56] References Cited

U.S. PATENT DOCUMENTS

| | | | |
|---|---|---|---|
| 3,987,315 | 10/1976 | Matsue | 307/279 |
| 4,002,930 | 1/1977 | Miura | 307/513 |
| 4,051,389 | 9/1977 | Kaneko et al. | 307/279 |
| 4,074,148 | 2/1978 | Sato | 307/269 |
| 4,441,039 | 4/1984 | Schuster | 307/279 |

OTHER PUBLICATIONS

Marino, "Differentially Operated Latches"; IBM Technical Bulletin; vol. 23, No. 1; p. 330, 6/80.

Primary Examiner—Stanley D. Miller
Assistant Examiner—Timothy P. Callahan
Attorney, Agent, or Firm—Wesley DeBruin

[57] ABSTRACT

Disclosed is a phase splitter with integrated latch circuit, where the complementary output signals generated after an input signal applied to a true-complement generator are available directly without any load by the latch circuit, where upon a premature change of the input signal there is no undesired change of the previously set switching state or of the output signals, respectively, and where a simple clocking for functional control can be used. The advantages presented by the disclosed Phase splitter substantially consist in that the speed with which the complementary output signals are supplied is extremely high since the output signals are available directly, i.e. with only one stage delay, the latch circuit being non-conductive in the stationary state, and thus in a latching process does not have to be switched from one stage to the other, but only switched on.

4 Claims, 3 Drawing Figures

PHASE SPLITTER WITH INTEGRATED LATCH CIRCUIT

BACKGROUND OF THE INVENTION

1. Cross-Reference to Related Application

U.S. patent application Ser. No. 448,135 entitled "True/Complement Generator", filed Dec. 9, 1982 by M. Grandguillot et al and of common assignee herewith.

2. Field of the Invention

The invention relates to a phase splitter with an integrated latch circuit. complement generator connected via a first clock-controlled switch to a current supply, and supplying complementary output signals as a function of an input signal, and having connected at its outputs one respective output stage.

3. Description of Prior Art

In its most conventional form, phase splitters consist of an inverter which supplies the inverted value of the input signal, whereas the non-inverted value is supplied through a direct connection of the input with the corresponding output. The numerous published and patented variations of this basic form show that for solving new problems a great variety of improvements and developments are required. So the mere generation of the inverted or complementary, and of the non-inverted or true output signal (which corresponds to the generation of an in-phase and of an out-of-phase signal) out of a given input signal is frequently not sufficient for ensuring the desired qualitative characteristics of the phase splitter. The demands for increased speed, reduced power dissipation, and exact timing between the individual signals in the circuit frequently necessitate the development of improved circuits and modes of operation. If the circuits are made in integrated technology there is the added demand for the realization of the circuit in a semiconductor body involving a minimum of space.

Many bistable circuits, e.g. in the form of flip-flops are also known and widely used. They also include latch circuits. The mode of operation of such circuits is an input receives a set signal and at the output an in-phase, or out-of-phase output, signal is generated. Owing to the feedback or latch function this output signal remains, even if in the meantime the set signal has been switched off. The output signal, i.e. the switching state of the circuit is maintained until a reset signal is applied to a reset input. In the known circuits of this kind the output signal is always delayed relative to the input signal releasing the switching process. The extent of this switching delay depends on the duration of the latching or switching process of the circuit itself. In high speed circuits of this kind, these time delays are frequently undesired or even inadmissible.

The following U.S. patents and publications are merely cited as background information. At least certain ones thereof are briefly discussed hereinafter. Further, the patents and publications listed below are not necessarily the most pertinent prior art.

U.S. Pat. No. 3,764,823 entitled "Timed True and Complement Generator" granted Oct. 9, 1973 to N. M. Donofrio et al.

U.S. Pat. No. 3,846,643 entitled "Delayless Transistor Latch Circuit" granted Nov. 5, 1974 to W. M. Chu et al.

U.S. Pat. No. 4,053,873 entitled "Self-Isolating Cross-Coupled Sense Amplifier Latch Circuit" granted Oct. 11, 1977 to L. B. Freeman et al.

"Address Buffer True/Complement Generator" by A. Furman, IBM Technical Disclosure Bulletin, Vol. 18, No. 11, April 1976, pp. 3597–8.

"Latched Inverter Buffer Circuit" by H. O. Askin et al, IBM Technical Disclosure Bulletin, Vol. 20, No. 4, September 1977, p. 1426–9.

"Data-Out Path with Minimum Delay" by H. H. Heimeier et al, IBM Technical Disclosure Bulletin, Vol. 24, No. 1B, June 1981, pp. 534–5.

From German Auslegeschrift No. 24 22 123, (U.S. Pat. No. 3,846,643) to give an example, a bistable latch circuit is known where the time delay of the output signal relative to the releasing input signal is reduced. An input-output circuit is provided which after an input signal directly supplies an output signal. The input-output circuit is coupled to the latch circuit which latches after the input signal, and thus maintains the output signal. The disadvantage of this circuit is that the latch circuit is in continuous operation and consequently continuously power-consuming, and has to be switched together with the input signal. This switching is a load on the input-output circuit and again causes an undesired time delay.

Quite a number of uses for a phase splitter are known where it is composed of a true-complement generator and a latch circuit. The purpose of this combination is to obtain through an input signal out-of-phase output signals in a minimum of time, and subsequently to effect a latching so that the set switching state is maintained even if the input signal is switched off, or even if there is a subsequent adding of a second input signal complementary to the first one.

Important fields of use are latching buffer circuits and latching read circuits for semiconductor storages. Buffer circuits are published e.g. in "IBM Technical Disclosure Bulletin", Vol. 20, No. 4, September 1977, pp. 1426–1429 and in "IBM Technical Disclosure Bulletin", Vol. 18, No. 11, April 1976, pp. 3597 and 3598. Apart from a true-complement generator, these circuits comprise a latch circuit where the signals supplied by the true-complement generator remain stored also after the releasing input signal of the true-complement generator, and are kept ready for further use. A disadvantage of the circuit of the first mentioned publication is that the output signal is available only after determination of the latching process, and that complex clocking of the circuit is required. Also, in the circuit disclosed in the second publication cited above, delays are caused in that the output signals are influenced by the latching process since the latching circuit is connected in parallel to the outputs of the true-complement generator.

Similar disadvantages are also shown by the latch read amplifiers disclosed in "IBM Technical Disclosure Bulletin, Vol. 20, No. 1B, June 1981, pp. 534 and 535, and in German Offenlegungsschrift No. 27 21 851 (U.S. Pat. No. 4,053,873). Here, too, it is a disadvantage that the latches used in the form of flip-flops are continuously active, i.e. that they are continuously current-conducting and can be switched in a corresponding switching process from one state into the other, thus causing additional delays.

SUMMARY OF THE INVENTION

The invention is intended to remedy these drawbacks. The invention maybe characterized as a phase splitter with integrated an latch circuit, where the complementary output signals generated after an input signal applied to a true-complement generator are available directly without any load by the latch circuit, where upon a premature change of the input signal there is no undesired change of the previously set switching state or of the output signals, respectively, and where a simple clocking for functional control can be used.

The advantages presented by the invention substantially consist in that the speed with which the complementary output signals are supplied is extremely high since the output signals are available directly, i.e. with only one stage delay, the latch circuit being non-conductive in the stationary state, and thus in a latching process does not have to be switched from one stage to the other, but only switched on.

A substantial advantage is also due to the fact that the latching process is initiated by the current supply through switching off the true-complement generator, which simplifies the clocking of the circuit as well as renders inactive the input of the true-complement generator for premature or undesired changes of the input signal.

Of particular importance is the feature of the phase splitter as disclosed by the invention according to which its function can substantially be ensured with one clock signal only.

The foregoing and other objects, features and advantages of this invention will be apparent from the following more particular description of the preferred embodiment of the invention, as illustrated in the accompanying drawing.

Figure 1:
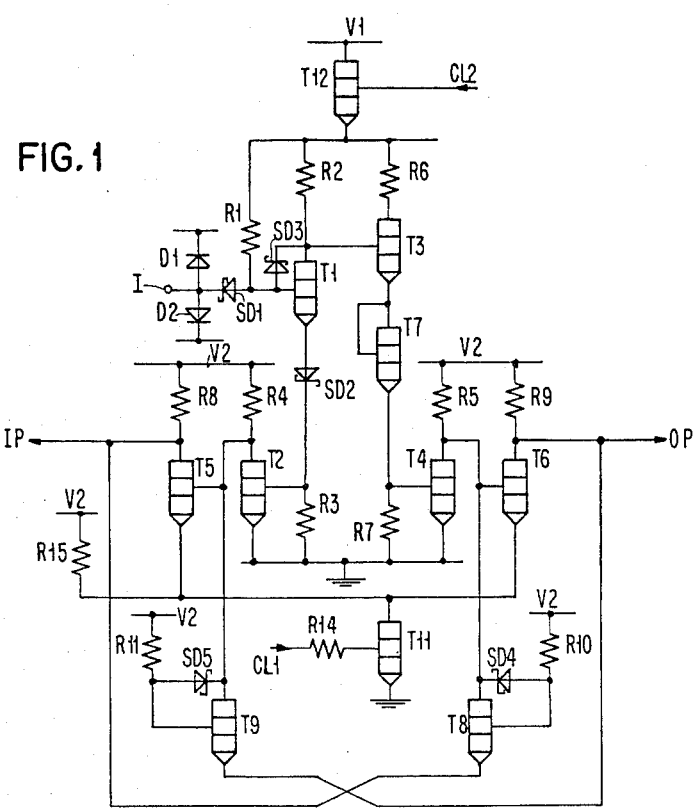
FIG. 1 shows the circuit diagram of a phase splitter in accordance with the invention.

In the following, the circuit structure of the phase splitter in accordance with the invention, as depicted in FIG. 1, will be discussed.

Figure 2:
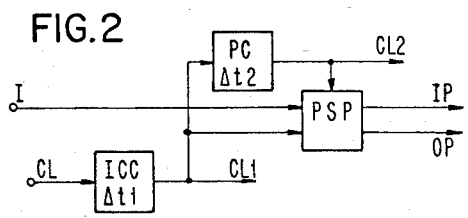
FIG. 2 shows a schematic representation of the control or clocking, respectively, of the phase splitter in accordance with the invention.

The phase splitter marked PSP in the schematic representation according to FIG. 2 is composed of three main basic components. These components are a true-component generator connected via a first switch to a current supply, two output stages connected to the outputs of the true-complement generator and activatable via a second switch, and a latch circuit consisting of a coupling unit connecting the output of one to the input of the other output stage.

Referring to FIG. 1, the true-complement generator comprises two series-connected transistor stages. The first transistor stage comprises a transistor T1 with a collector load resistor R2 and an emitter resistor R3. Furthermore, a resistor R1 is provided for the base current setting. Connected to the base of this transistor T1, input I of the true-complement generator is applied, two anti-parallel, level-limiting diodes D1 and D2 connected to the reference potential, and Schottky diode SD1 series connected with the base being included in the input circuit in the present embodiment. For level shifting or adaptation, a Schottky diode SD2 is additionally provided in the emitter circuit of transistor T1. Between collector and base, a saturation-preventing Schottky diode SD3 is provided.

The collector output of the first transistor stage is connected to the base of a transistor T3 forming the second transistor stage of the true complement generator. This transistor stage comprises a collector load resistor R6, and emitter resistor R7, and in the present embodiment an additional transistor T7 provided as a diode in the emitter circuit. Emitter resistors R3 and R7 of the two transistor stages are jointly applied to reference potential, whereas collector load resistors R2 and R6 are applied via the emitter-collector path of a transistor T12 forming the first switch, to a voltage source V1 providing the current supply of the true-complement generator. This first switch T12 is controllable via a clock signal CL2 at the base of transistor T12. The emitter outputs of the two transistor stages are each connected to the base of another transistor T2 and T4 operated in emitter configuration, comprising collector load resistors R4 and R5. The collector outputs of these two transistors T2 and T4 form the output of the true-complement generator.

The abovementioned output stages each comprise a transistor T5 and T6, respectively, with collector load resistors R8 and R9 applied to a voltage source V2 which also provides the current supply for transistors T2 and T4. The emitters of these two transistors T5 and T6 are, on the one hand, jointly connected to reference potential via the collector emitter path of a transistor forming the above mentioned second switch, and via a resistor R15 to the operating voltage V2. The switch is controlled via a clock signal CL1 applied via a resistor R14 to the base of transistor T11. The collector outputs of the two transistors T5 and T6 forming the two output stages represent the two out-of-phase outputs IP and OP of the phase splitter.

The latch circuit forming the third basic component of the phase splitter substantially comprises two transistors T8 and T9 which represent active coupling stages and respectively connect the output of the one with the input of the other output stage T5, T6. The collector of transistor T8 is applied to the base of transistor T6, whereas the emitter is connected to the output IP of the phase splitter. The collector of transistor T9 is applied to the base of transistor T5, whereas the emitter is connected to the output OP of the phase splitter. The bases of these two transistors T8 and T9 are respectively connected to the operating voltage V2 via a resistor R10 or R11, respectively. Between base and collector one respective Schottky diode SD4, SD5 is inserted which prevents the conductivity of the associated transistor in an inverse direction.

The desired phase splitter latching is effected via these two coupling stages.

In the following, the operation of the phase splitter in accordance with the invention will be described. Reference is made to block PSP, FIG. 2, and to FIG. 1 in connection with FIGS. 2 and 3 representing the clock control and the associated pulse diagram.

Figure 3:
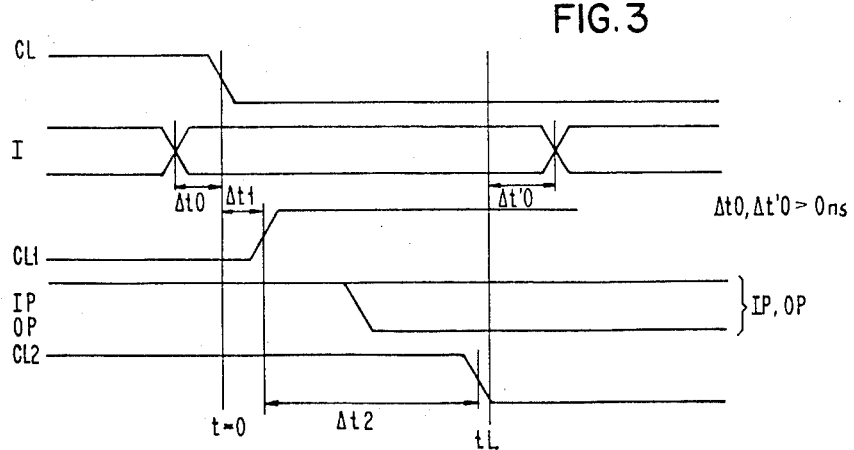
FIG. 3 shows a pulse diagram characterizing the function of the phase splitter in accordance with the invention.

As clearly expressed in FIGS. 2 and 3, it is an essential feature that for controlling the phase splitter according to the invention only one external clock signal CL is to be applied, from which on the semiconductor chip itself containing the phase splitter two more clock signals CL1 and CL2 are derived. These derived clock signals are slightly delayed with respect to the external clock signal CL. The delay $\Delta t1$ of the clock signal CL1 derived from the external clock signal CL is caused in an input control circuit ICC (FIG. 2). The delay Δt2 of the clock signal CL2 derived from clock signal CL1 is executed in the current supply circuit PC (FIG. 2) of phase splitter PSP. In a practical embodiment, Δt1 can be approximately 2 ns and Δt2 can be approximately 5 ns. Clock signal CL1 switches on the second switch (transistor T11), so that the output stages (transistors T5 and T6) are activated. By means of clock signal CL2, the first switch (transistor T12) is switched on, so that the true-complement generator (transistor T1 to T4) is connected to the current supply (reference potential V1). A safe operation is ensured since Δt2 starts only if Δt1 is over.

In the stationary state of the circuit, conditions are as depicted in the pulse diagram of FIG. 3, at the left of time t=0. The external clock pulse CL reaches the upper level, which means that the clock signal CL1 derived therefrom has reached the lower level, and that consequently the second switch is not conductive, i.e. transistor T11 is off. If the second switch is not conductive, the two output stages (T5, T6) are without current. Clock signal CL2 reaches the upper level, which means that the first switch is switched on, i.e. transistor T12 is conductive. If the first switch in switched on, the true-complement generator (T1 to T4) is connected to current supply. The fact that the true-complement generator is activated already in the stationary state of the circuit has the advantage that it does not have to be activated at the beginning of a selection phase. The consequently following power dissipation in the stationary state is extremely low. Since both transistors T5 and T6 of the output stages are non-conductive, the transistors T9 and T8 forming the two coupling stages are non-conductive.

In the following, the selection phase will be discussed which at time t=0 (FIG. 3) starts with the dropping of the releasing external clock signal CL to the lower level. The only condition for correct functioning is that the input signal I is already valid at the beginning of the selection phase (Δt0>0). As the true complement generator (transistor T1 to T4) is already activated it supplies to the bases of transistors T5 and T6 of the output stages a already valid signal as soon as after an delay of Δt1 clock signal CL1 switches from the lower to the upper level, and thus switches on the second switch (transistor T11) and activates the two output stages (T5, T6). In this manner, the complementary output signals corresponding to the input signal are produced at outputs IP and OP. The information applied at input I consequently has to pass through only one switching stage to be validly available at the output IP and OP of the phase splitter. Together with the switching-on of transistors T5 or T6 of the output stages, the internal latch function is activated, but only if owing to the dropping clock signal CL2, delayed by the time Δt2, the true-complement generator is switched off supply by the first switch (T12). Transistors T2 and T4 are rendered non-conductive, this latching process does not have to comprise a switching; only one of the true-complement coupling stages is rendered conductive. As the latching process is effected via the first switch (T12) by the switching-off of the current supply for the true complement generator, the set output signals are maintained in a possible subsequent unintentional alteration of the input signal. The latching process is effected at time tL when the first switch (T12) is switched off.

If at input I of the circuit an upper signal level according to a binary 1 is applied, transistors T1 and T2 are switched on, and there is a lower level at the collector of transistor T2. The base of transistor T3 is brought to a lower level of $2 \times V_{BE}$ over reference potential, so that the voltage at the base of transistor T4 is thus kept in the off state. Compared with the voltage at the collector of transistor T2, the complementary information (upper level) is now at the collector of transistor T4.

If a signal level corresponding to a binary 0 is applied at input I of the circuit, transistors T1 and T2 are nonconductive, and transistors T3, T4 and T7 are conductive. The collector voltages of transistors T2 and T4 are reversed accordingly.

The input signal I has of course to be available at the input slightly in excess of time tL (Δt'0>0) until the latching process has been initiated or terminated, respectively. To render the switching speed of the phase splitter as independent as possible of an external supply voltage and of temperature influences, a current supply circuit PC is used which is integrated on the semiconductor chip.

A feature of particular advantage is that the output stages (T5, T6) are switched on immediately with the first internal clock signal CL1 since the low power true-complement generator supplies the correct information to the bases of transistors T5 and T6 at the beginning of the cycle. In this manner, outputs IP and OP very rapidly supply correct and failure-free signals.

Only a few nanoseconds later, the true-complement generator which controls the two output stages (T5, T6) can be switched off via the clock signal CL2, so that the information at input I is fixedly stored into the phase splitter. Compared with its power dissipation, the circuit operates with a very high speed. Apart from one single clock signal CL, it does not require any additional auxiliary signals whose functions and tolerances delay the output signal.

While the invention has been particularly shown and described with reference to the preferred embodiment thereof, it will be understood by those skilled in the art that various changes in form and details may be made therein without departing from the spirit and scope of the invention.

What we claim is:

1. In an integrated circuit, phase splitter circuit means with a latch circuit incorporated therein, said splitter circuit means comprising:

an input terminal adapted to receive a binary input;
a in-phase output terminal adapted to provide an in-phase (true) output of said binary input;
a out of phase output terminal adapted to provide an out of phase (complementary) output of said binary input;
a first potential source for providing a first potential;
a second potential source for providing a second potential;
a third potential source for providing a third potential;
a first switch circuit having first and second terminals and a control input, said first terminal of said first switch circuit being connected to said first potential source;
a second switch circuit having first and second terminals and a control input, said first terminal of said second switch circuit being connected to said third potential source;

a first transistor having an emitter, base and collector, said base of said first transistor being connected to said input terminal;

a first resistor connected between said base of said first transistor and said second terminal of said first switch circuit;

a second resistor connected between said collector of said first transistor and said second terminal of said first switch circuit;

a second transistor having an emitter, base and collector, said emitter of said second transistor being connected to said third potential source;

a third resistor connected between said base of said second transistor and said third potential source;

a fourth resistor connected between said collector of said second transistor and said second potential source;

a first diode connected between said emitter of said first transistor and said base of said second transistor;

a third transistor having an emitter, base and collector, said base of said third transistor being connected to said collector of said first transistor;

a fourth transistor having an emitter, base and collector, said emitter of said fourth transistor being connected to said third source of potential;

a fifth resistor connected between said collector of said fourth transistor and said second potential source;

a sixth resistor connected between said collector of said third transistor and said second terminal of said first switch circuit;

a seventh resistor connected between said base of said fourth transistor and said third source of potential;

a fifth transistor having an emitter, base and collector, said base of said fifth transistor being connected to said collector of said second transistor;

a sixth transistor having an emitter, base and collector, said base of said sixth transistor being connected to said collector of said fourth transistor;

a seventh transistor having an emitter, base and collector, said base and collector of said seventh transistor being connected in common to said emitter of said third transistor, said emitter of said seventh transistor being connected to said base of said fourth transistor;

an eigth resistor connected between said collector of said fifth transistor and said second parallel source;

a ninth resistor connected between said collector of said sixth transistor and said second potential source;

an eighth transistor having an emitter, base and collector, said collector of said eighth transistor being connected to said collector of said fourth transistor, said emitter of said eighth transistor being connected in common to said collector of said fifth transistor and said in phase output terminal;

a ninth transistor having an emitter base and collector, said collector of said ninth transistor being connected to said collector of said second transistor, said emitter of said ninth transistor being connected in common to said collector of said sixth transistor and said out of phase output terminal;

a tenth resistor connected between said base of said eighth transistor and said second potential source;

an eleventh resistor connected between said base of said ninth transistor and said second potential source; and, a twelfth resistor connected between a common connection of said emitters of said fifth and sixth transistors and said second terminal of said second switch circuit, and said second potential source.

2. In an integrated circuit, phase splitter circuit means with a latch circuit incorporated therein, as recited in claim 1, wherein said first switch circuit comprises a tenth transistor having an emitter, base and collector, said collector of said tenth transistor being connected to said first terminal of said first switch circuit, said emitter of said tenth transistor being connected to said second terminal of said first switch circuit, said base of said tenth transistor being connected to said control input of said first switch circuit, and where said second switch circuit comprises an eleventh transistor having an emitter, base and collector, said collector of said eleventh transistor being connected in common to said emitters of said fifth and sixth transistors, said emitter of said eleventh transistor being connected to said third potential source, said base of said eleventh transistor being connected to said control input of said second switch.

3. In an integrated circuit, phase splitter circuit means with a latch circuit incorporated therein, as recited in claim 2, wherein said control input of said second switch circuit is adapted to receive a first clock signal and said first switch circuit is adapted to receive a second clock signal.

4. In an integrated circuit, phase splitter circuit means with a latch circuit incorporated therein, as recited in claim 3, wherein said first and second clock signals bear a fixed time relationship one with respect to the other and said first and second clock signals are derived from single clock signal.

* * * * *

UNITED STATES PATENT AND TRADEMARK OFFICE
CERTIFICATE OF CORRECTION

PATENT NO. : 4,542,309

DATED : September 17, 1985

INVENTOR(S) : Wilfried Klein et al

It is certified that error appears in the above-identified patent and that said Letters Patent is hereby corrected as shown below:

Column 1, line 14, after "circuit." delete --complement generator connected--.

Column 1, lines 15 thru 18 cancel said lines.

Signed and Sealed this

Nineteenth Day of November 1985

[SEAL]

Attest:

DONALD J. QUIGG

Attesting Officer

Commissioner of Patents and Trademarks